United States Patent [19]
Yamamoto et al.

[11] Patent Number: 5,272,546
[45] Date of Patent: Dec. 21, 1993

[54] LASER BEAM CONTROLLER

[75] Inventors: Haruo Yamamoto, Sennan; Akira Shimatani; Hidechika Kumamoto, both of Sakai; Masaya Fujimoto, Kobe; Tsukasa Matsushita, Daito, all of Japan

[73] Assignee: Mita Industrial Co., Ltd., Japan

[21] Appl. No.: 664,313

[22] Filed: Mar. 4, 1991

[30] Foreign Application Priority Data

Mar. 16, 1990 [JP] Japan ................... 1-67915

[51] Int. Cl.$^5$ ............ H04N 1/40; G01D 15/00
[52] U.S. Cl. ..................... 358/475; 358/481; 358/298
[58] Field of Search ............ 358/401, 409, 410, 411, 358/412, 420, 423, 455, 456, 471, 480, 481, 475, 474, 296, 298; 346/108, 107 R, 160; 250/214 P, 205

[56] References Cited

U.S. PATENT DOCUMENTS

| | | | |
|---|---|---|---|
| 4,347,523 | 8/1982 | Ohara | 358/298 |
| 4,914,459 | 4/1990 | Mama et al. | 346/160 |
| 4,926,263 | 5/1990 | Yokota | 358/409 |

FOREIGN PATENT DOCUMENTS 3408187 9/1984 Fed. Rep. of Germany.

OTHER PUBLICATIONS

Patent Abstracts of Japan, vol. 13, No. 364 (E-805), Aug. 14, 1989 & JP-A-1 120 115 (Mita Ind. Co. Ltd.).

Primary Examiner—Edward L. Coles, Jr.
Assistant Examiner—Jerome Grant
Attorney, Agent, or Firm—Beveridge, DeGrandi, Weilacher & Young

[57] ABSTRACT

A laser beam controller comprises a basic pulse signal generating circuit, a delay circuit, a delay control circuit, a pulse generating circuit and a laser beam generator. The basic pulse signal generating circuit generates periodically occurring basic pulse signal. The delay circuit delays the basic pulse signal. The delay control circuit controls the delay time of the basic pulse in the delay circuit according to image data. The pulse generating circuit generates an output pulse having a width corresponding to the delay time of the basic pulse signal. The laser beam generator generates a laser beam for a duration corresponding to the width of the output pulse by said pulse generating circuit. According to the controller, any desired gradation of a pixel of the image is desirably produced.

10 Claims, 5 Drawing Sheets

LASER BEAM CONTROLLER

BACKGROUND OF THE INVENTION

The present invention relates to a laser beam controller used in a digital copying machine etc.

In a digital copying machine using a laser beam for creating a latent image, the place where a laser beam is irradiated makes a black point and the place where a laser beam is not irradiated makes a white point in a copied image. When the laser beam control is such that the whole area of a unit pixel is either fully irradiated (black) or not irradiated (white), the gradation appearance of the copied image is poor. One method of increasing the gradation of the copied image is to reduce a spot size of the laser beam and thereby the spot of the beam is irradiated onto a limited portion (or portions) of a pixel area. Another method is to vary the duration of the laser beam irradiation time while maintaining a predetermined size of a spot of the laser beam. In the latter method, the width of a clock pulse for generating a laser beam may be varied to multi-widths (e.g., four widths).

In the former method where a laser beam size is controlled, however, some analog processings must be introduced in the laser beam control circuit, which complicates the control circuit and the design. In the latter method, the clock pulse should be very small (i.e., the clock pulse should have very high frequency). Accordingly, the latter method requires a very high frequency circuit to generate the clock pulse, which is generally expensive.

SUMMARY OF THE INVENTION

An object of the present invention is to provide a laser beam controller that can control the duration of a laser beam for producing any desired gradation of a pixel of an image.

Another object of the present invention is to provide such laser beam controller without using expensive circuits or elements.

These and other objects are achieved by the present invention for a laser beam controller used for turning on and off a laser beam while scanning the laser beam on a photoreceptor surface to create a latent image composed of a matrix of pixels according to image data. The laser beam controller of the present invention comprises: a basic pulse signal generating circuit for generating periodically occurring basic pulse signal; a delay circuit for delaying said basic pulse signal; a delay control circuit for controlling the delay time of said basic pulse signal in said delay circuit according to image data; a pulse generating circuit for generating an output pulse having a width corresponding to the delay time of said basic pulse signal; and means for generating a laser beam in said optical system for a duration corresponding to the width of the output pulse by said pulse generating circuit.

The present invention includes many other detailed features which are detailed in the description of an embodiment that follows.

BRIEF DESCRIPTION OF THE ATTACHED DRAWINGS

DETAILED DESCRIPTION OF THE PREFERRED EMBODIMENTS

Figure 3:
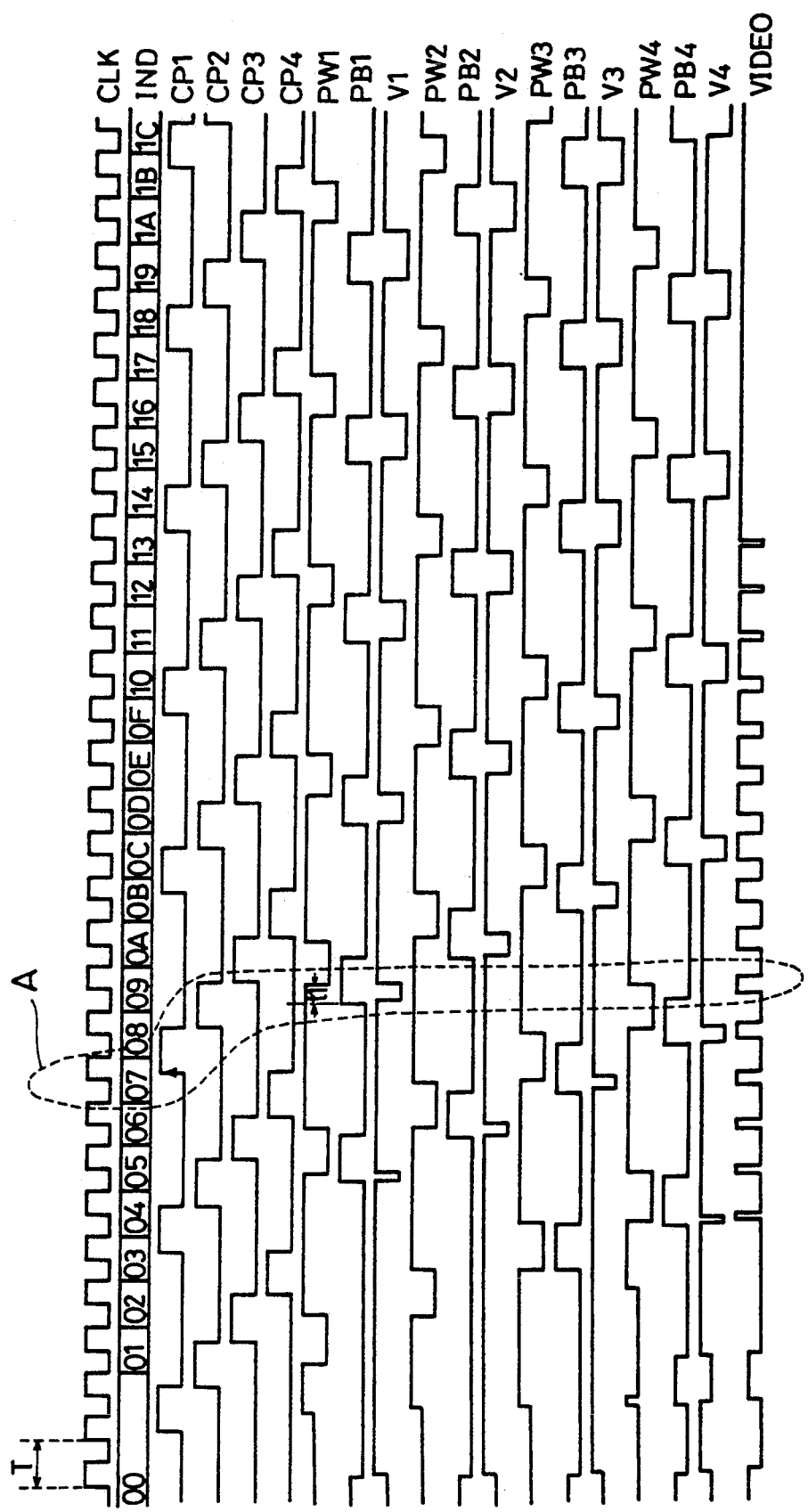
FIG. 3 is a timing chart of various pulse signals used in the beam control pulse generating circuit of FIG. 2.
Figure 4:
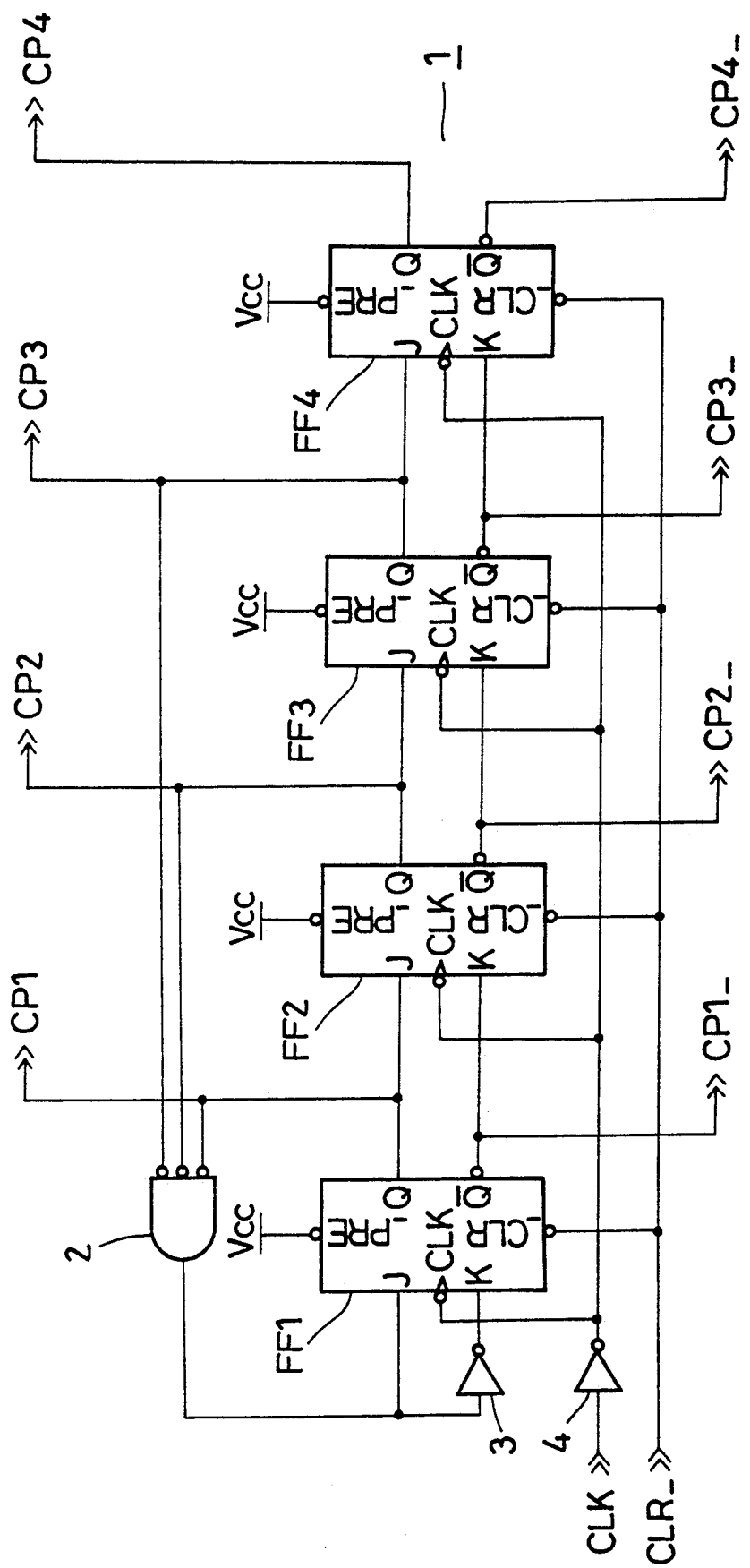
FIG. 4 is a circuit diagram of a basic pulse generating circuit of the embodiment.

The present invention is detailed here referring to the attached drawings illustrating an image recording system. First, four basic pulse signals CP1, CP2, CP3 and CP4 are generated using a ring counter as shown in FIG. 4. The four basic pulse signals carry a queue of periodical pulses (basic pulses) having the same width but different phases from basic pulses of other basic pulse signals, as shown in FIG. 3. The width of the basic pulses is the same as the cycle time T of the reference clock pulse CLK, and corresponds to the width of a pixel of an image to be created by the image recording system. The basic pulses of the four basic pulse signals occur sequential: i.e., when the first basic pulse CP1 falls down, the second basic pulse CP2 rises up; when the second basic pulse CP2 falls down, the third basic pulse CP3 rises up, etc.

The ring counter 1 shown in FIG. 4 includes: four JK flip flops FF1, FF2, FF3 and FF4; a NAND gate 2; and two inverters 3 and 4. The ring counter 1 may be constructed otherwise as long as the four basic pulse signals CP1, CP2, CP3 and CP4 are adequately generated.

Figure 1:
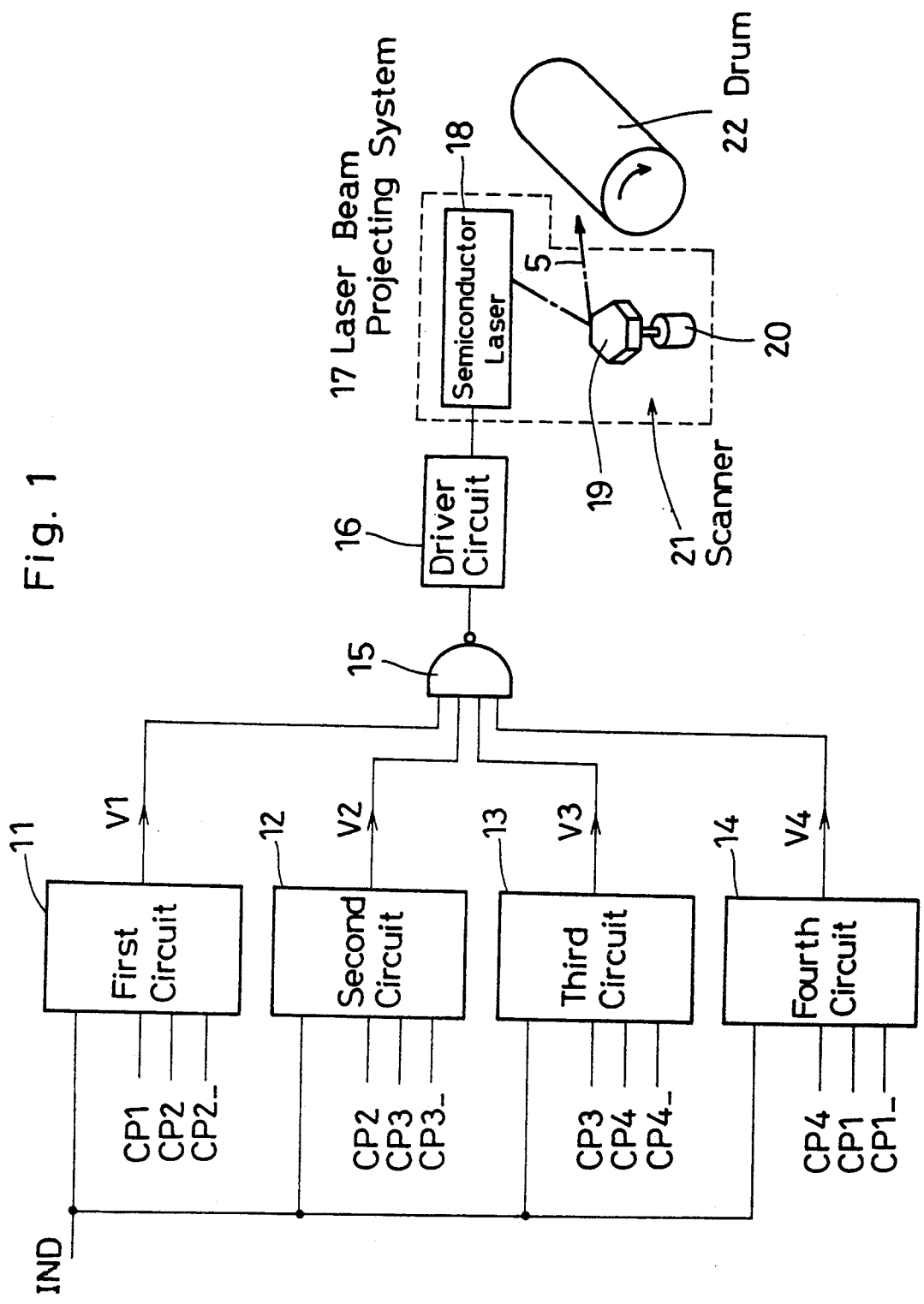
FIG. 1 is a block diagram of an image recording system as an embodiment of the present invention.

The four basic pulse signals CP1, CP2, CP3 and CP4 generated by the ring counter 1 are sent to a laser beam control circuit shown in FIG. 1. The laser beam control circuit includes: four (1st, 2nd, 3rd and 4th) beam control pulse generating circuits 11, 12, 13, 14; a NAND gate 15; and a driver circuit 16 for a laser beam projecting system 17. The four beam control pulse generating circuits 11, 12, 13 and 14 have the same internal structure; each circuit receives four input signals and provides one output signal, but three of the four input signals are different from circuit to circuit. The input signals of the first beam control pulse generating circuit 11 are: image data IND, the first and second basic pulses CP1, CP2, and an inverted pulse CP2− of the second basic pulse CP2. The output signal of the first beam control pulse generating circuit 11 is a pulse denoted as V1. The second beam control pulse generating circuit 12 also receives the same image data IND, but the other three inputs are the second and third basic pulses CP2, CP3 and an inverted third basic pulse CP3−. The output signal of the second beam control pulse generating circuit 12 is another pulse V2. Similarly, the third and fourth circuits send out pulses V3 and V4, respectively, based on the image data IND and cyclically changed input signals. The output pulses V1, V2, V3 and V4 of the respective beam control pulse generating circuits 11, 12, 13 and 14 are shown in FIG. 3.

The NAND gate 15 receives the four output pulses V1, V2, V3 and V4 from the four beam control pulse generating circuits 11, 12, 13 and 14, and outputs the logical result to the driver circuit 16. The laser beam projecting system 17 includes a semiconductor laser 18 and a scanner 21. The semiconductor laser 18 turns on and off according to the output of the driver circuit 16 (when the input pulse to the driver circuit 16 is high, a laser beam is generated), and the scanner 21 deflects the laser beam 5 generated by the semiconductor laser 18 with a polygon mirror 19 rotated by a motor 20 to scan the laser beam on the surface of a photoreceptor drum 22. A latent image created by the laser beam 5 on the drum 22 is developed by a developer (not shown) with toner powder and the toner image is transferred to a sheet of paper.

Figure 2:
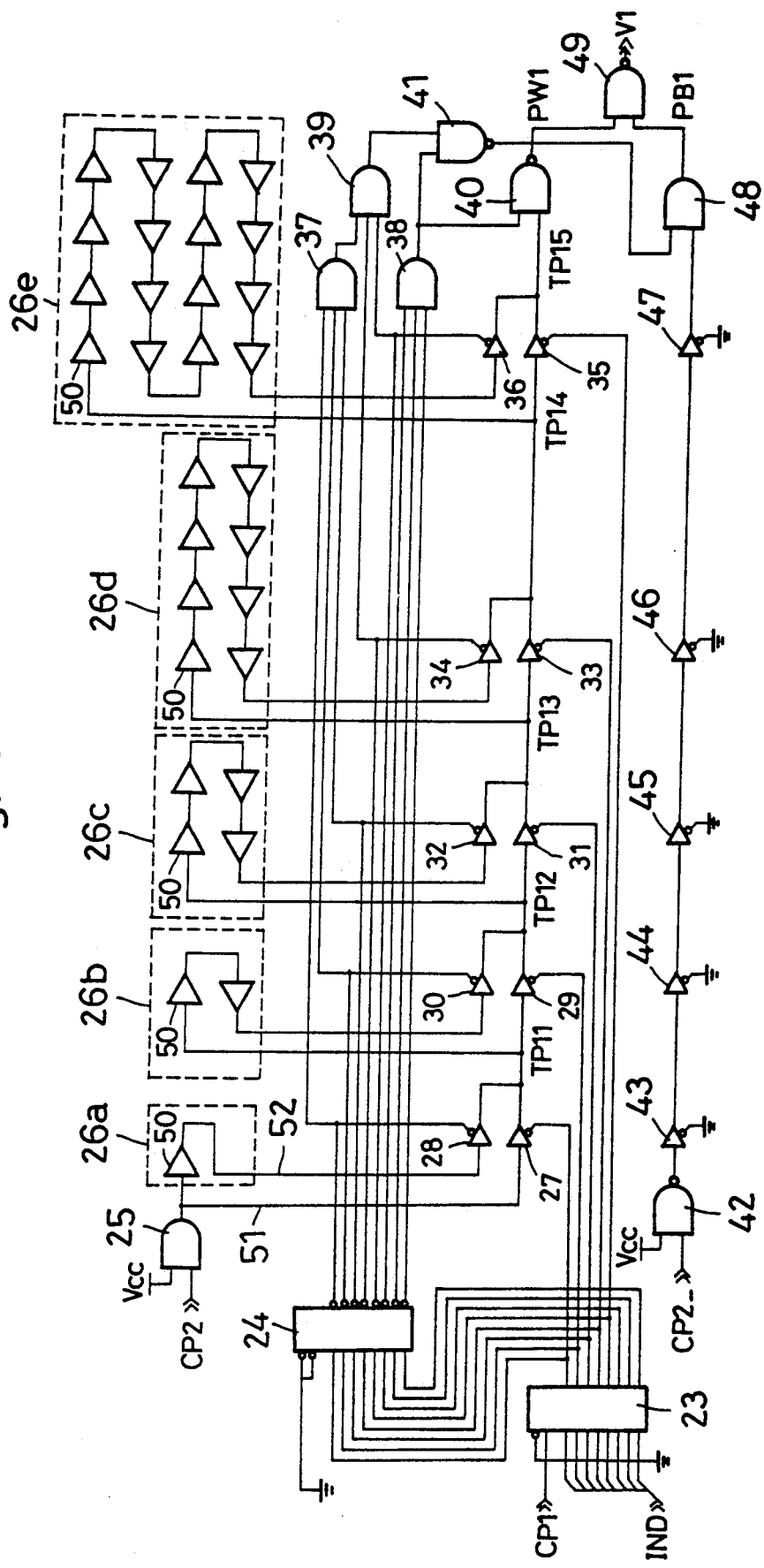
FIG. 2 is a detailed circuit diagram of a beam control pulse generating circuit of the image producing system.

The structure of the first through fourth beam control pulse generating circuits 11-14 is now described referring to FIG. 2 showing the first beam control pulse generating circuit 11 as the representative. Image data IND is first input into a first latch circuit 23 which is a D-type flip flop, and is latched by a first basic pulse CP1 also input into the latch circuit 23. The output of the first latch circuit 23 is given to five three-state buffers 27, 29, 31, 33 and 35. In this embodiment, the image data IND is 8 bit but the three MSBs (most significant bits) of the image data IND are always zero (0, 0, 0). That is, the three MSBs are not used but only five LSBs (least significant bits) of the image data IND are used to determine the gradation of the pixel. Thus, the remaining five significant bits (LSBs) are sent to the enable terminals of the five three-state buffers 27, 29, 31, 33 and 35 respectively (first bit to the buffer 27 and the fifth bit to the buffer 35).

The output of the first latch circuit 23 is also sent to an inverter 24 where every bit of the 8 bit output is inverted. Similarly to the case described above, the five LSBs of the inverted data is given to the enable terminals of another five three-state buffers 28, 30, 32, 34 and 36. The ten three-state buffers 27-36 turn conductive (turn on) when the input signal (respective bit of the inverted/non-inverted image data) is low (i.e., zero). An AND gate 25 is provided in the first beam control pulse generating circuit 11 to take the AND of the source voltage Vcc and the second basic pulse CP2. The output of the AND gate 25 is in one way sent directly through line 51 to the first one 27 of the five three-state buffers 27-35 controlled by the non-inverted image data, and in another way delayed by a delay circuit 26a and sent through line 52 to the first one 28 of another five three-state buffers 28-36 controlled by the inverted image data. The outputs of the first three-state buffers 27 and 28 are joined at a junction TP11, and the joined output is similarly divided into two ways as the output from the AND gate 25: one is directly sent to one 29 of the next stage three-state buffers and the other is delayed by a second delay circuit 26b and sent to the other next stage three-state buffer 30. The outputs of the three-state buffers 29 and 30 are then joined at a junction TP12. The joined output is then divided into two ways: one is directly sent to one 31 of the next stage three-state buffers and the other is delayed by a third delay circuit 26c and sent to the other next stage three-state buffer 32. The outputs of the three-state buffers 31 and 32 are joined at a junction TP13, and the joined output is divided into two ways: one directly to the next stage three-state buffer 33 and the other delayed by a fourth delay circuit 26d and to the other next stage three-state buffer 34. The outputs of the three-state buffers 33 and 34 are joined (TP14) and sent to the next stage three-state buffers 35 and 36 with one of them delayed by a fifth delay circuit 26e. The outputs of the final stage three-state buffers 35 and 36 are also joined at TP15 and sent to a NAND gate 40.

The delay circuits 26a-26e are made of one or plural buffer ICs 50. The number of the buffer ICs 50 of respective delay circuits 26a-26e increases as $2^n$ (n=0, 1, 2, 3, 4): the first delay circuit 26a includes $2^0=1$ buffer IC 50; the second 26b, $2^1=2$; the third, $2^2=4$; the fourth, $2^3=8$; and the fifth, $2^4=16$ buffer ICs 50. According to the number of buffer ICs 50, the delay time of respective delay circuits 26a-26e increases as $2^n$ times. Using delay circuits 26a-26e having different delay times as such, delay time of 1 to 31 times of a unit delay time (of a buffer IC 50) can be obtained without fail by combining two or more delay circuits 26a-26e. The combination of the delay circuits 26a-26e is chosen by the five LSBs of the image data IND.

A NAND gate 42 is provided in the first circuit shown in FIG. 2. The NAND gate 42 outputs a logic NAND of the source voltage Vcc and the inverted pulse CP2− of the second basic pulse CP2. The output of the NAND gate 42, having the same value as the basic pulse CP2, is sent to an AND gate 48 through five three-state buffers 43-47, all of whose enable terminals are grounded, in order to compensate for the delay of the image data necessarily passing through five of the ten three-state buffers 27-36. This compensation is necessary because, in the present embodiment, the delay of the basic pulse CP2 from the AND gate 25 caused by image data is determined by comparing it with the basic pulse CP2 passing through the NAND gate 42.

Three LSBs of the inverted image data (latched output of the inverter 24) are sent to an AND gate 37, as well as to the respective three-state buffers 28, 30 and 32. The output of the AND gate 37 is sent to the next stage AND gate 39. The fourth and fifth bits of the inverted image data from the inverter 24 are sent to the AND gate 39, as well as to the respective three-state buffers 34 and 36. The output of the AND gate 39 is sent to a NAND gate 41. The three MSBs of the output of the inverter 24 which are, as described before, always zero (i.e., they do not carry information) are sent to an AND gate 38. The output of the AND gate 38 is sent to NAND gates 40 and 41. The output of the NAND gate 41 and the output of the AND gate 42 (which passes through the five buffers 43-47) are sent to an AND gate 48. The output PB1 of the AND gate 48 and the output PW1 of the NAND gate 40 are sent to a NAND gate 49, whose output is the output V1 of the first beam control pulse generating circuit 11.

The image data given to the latch circuit 23 is an 8-bit data, but the 256 ($=2^8$) step gradation carried by the image data is degenerated to 17 step gradation in this embodiment. The full width of the output pulse V1 corresponds to the highest (17th) degree of the gradation which also corresponds to a full width of a pixel (dot) of the laser beam image. Thus the three MSBs of the image data are always zero. If image data having bit 1 in any one of the three MSBs is input into the latch circuit 23, the value of the image data exceeds the upper limit value of the gradation steps (theoretically, the upper limit value is 31=(1, 1, 1, 1, 1), but since the number of the gradation steps are limited to 17 in this embodiment, the upper limit value is 17=(1, 0, 0, 0, 1)). In order to prevent the output pulse V1 becoming larger than the upper limit, following logic circuits are prepared. When any one of the three MSBs is 1, at least one of the corresponding three output bits of the inverter 24 is zero, and thus the output of the AND gate 38 is zero (0). Then the output of the NAND gate 40 is one (1), and the output of the NAND gate 49 is always the inverse of the output of the AND gate 48. Since the input from the NAND gate 41 is one (1), the output of the AND gate 48 depends on the output of the three-state buffer 47. Since the output of the three-state buffer 47 is substantially the same as the basic pulse CP2, the basic pulse CP2 is sent out from the NAND gate 49. This means that the output pulse V1 of the first beam control pulse generating circuit 11 is restricted at its maximum (i.e., the maximum value of the five LSBs, corresponding to a full width of one pixel) when at least one of the MSBs is 1. Since the number of the gradation steps is set at 17 in this embodiment, the image data corresponding to the value larger than 17 (i.e., data having five LSBs from (0, 1, 0, 0, 1) to (1, 1, 1, 1, 1), where the notation is such that LSB is at left) is limited to 17=(1, 0, 0, 0, 1) in the output pulse V1.

When all bits of the image data given to the latch circuit 23 are zero (i.e., no image data), the output V1 should be zero. But when a sporadic noise generated in the circuit comes to the junction TP15, the noise may make an erroneous output data. Generation of such an erroneous output is prevented in this embodiment as follows. When all 8 bits of the image data are zero, all of the inputs to the AND gate 37 are one (1), and the output of the AND gate 37 is one (1) and the inputs to the following AND gates 39 are all one (1). Thus the signal sent from the AND gate 39 to the NAND gate 41 is one (1). On the other hand, the input to the AND gate 38 is one (1), and thus the output is also one (1), which makes the output of the NAND gate 41 zero (0). Then the output of the AND gate 48 is zero (0), and after all the output of the NAND gate 49 is always one (1) irrespective of the value of the input from the NAND gate 40, and no pulse is generated to turn on a laser beam because the output of the NAND gate 49 is inverted to be zero at the NAND gate 15 in FIG. 1. Thus, even if a noise pulse is generated at the junction TP15, the pulse is prevented from going out of the beam control pulse generating circuit 11 and no erroneous laser beam is generated.

Normal operation of the beam control pulse generating circuit 11 will be now explained referring to FIG. 3. This circuit includes five delay circuits 26a-26e which have different delay time from one another and are independently controlled by respective five bits of the image data. Therefore thirty-two different delay times can be obtained by properly combining the delay circuits 26a-26e. But the hardware of the image producing system including the laser beam projecting system 17 and the photoreceptor drum 22 restricts the allowable number of combinations. In this embodiment, as described above, the number of combinations is 17, and the image data ranging from (0,0,0,0,0) to (1,0,0,0,1) are meaningful in this embodiment, and the maximum value (1,0,0,0,1) corresponds to the full duration of the laser beam for one pixel of the image.

In many image processing systems, image data are composed of 8 bits and the gradation is 256 steps. When receiving such an image data, the 8-bit, 256-step image data is converted into the 17-step data in an appropriate data converter (not shown) placed before the latch circuit 23. When, for example, image data having the five LSBs of (1, 1, 1, 0, 0) is given to the latch circuit 23, three-state buffers 28, 30, 32, 33 and 35 turn on, and three delay circuits 26a, 26b and 26c are selected and become effective. Then the basic pulse CP2 given to the AND gate 25 is delayed by the three delay circuits 26a, 26b and 26c to become a pulse PW1 which is delayed by a time t1 (shown in the dashed closure A) from the output PB1 of the NAND gate 48. Therefore the output V1 of the next NAND gate 49 is a pulse having the width equal to the delay time t1. Thus, the pulse width of the output pulse V1 of the beam control pulse generating circuit 11 varies according to the value of the image data.

Each of the four outputs V1, V2, V3 and V4 are intermittently sent out from respective one of the first through fourth beam control pulse generating circuits 11 12, 13 and 14 at the timing of every four pixels (dots), and thus the four outputs V1, V2, V3 and V4 come into the NAND gate 15 sequentially, where the four outputs V1, V2, V3 and V4 are merged to become the VIDEO signal including pulses for all pixels (with proper gradation values) of the image.

Figure 5:
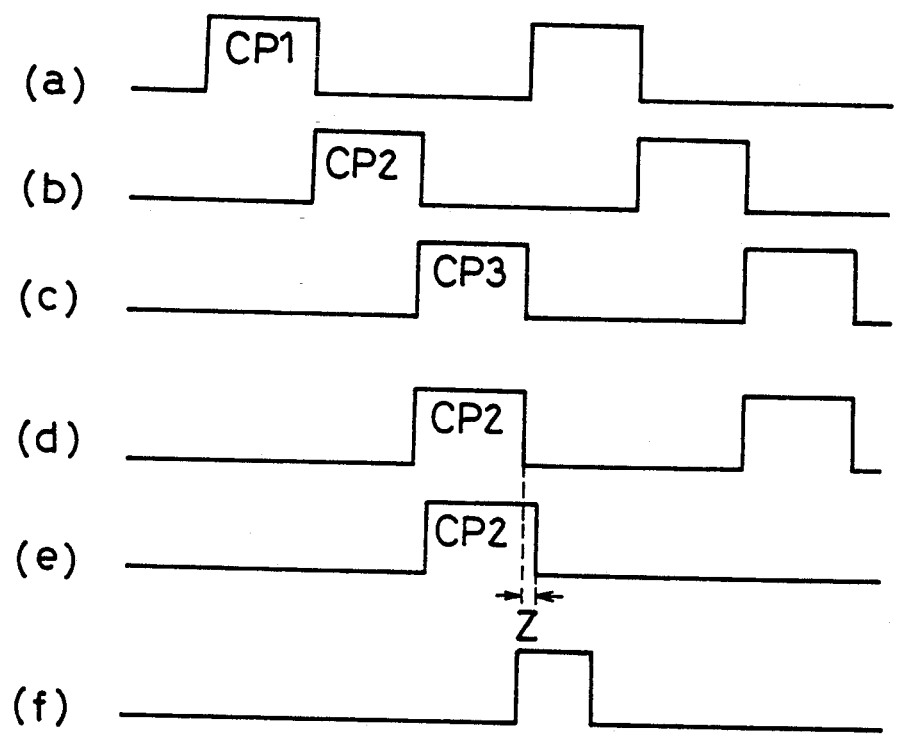
FIG. 5 is a timing chart illustrating a case where a basic pulse is overdelayed to overlap the next basic pulse.

The reason why the laser beam generating signal is made up from plural beam control pulse generating circuits 11 through 14 in this embodiment is as follows. If the laser beam generating signal is made by one circuit, correct output pulses cannot be obtained because the next basic pulse may be generated while a previous basic pulse is being delayed. Therefore, more than two of the circuits as shown in FIG. 2 are necessary, and the basic pulses should have different phases from one another. Further, for avoiding malfunctions caused by variations in the delay time of the buffers composing the delay circuits, it is preferable to use four circuits as shown in FIG. 1. For clarifying this point, an example is described referring to FIG. 5 where three beam control pulse generating circuits and three basic pulses are used. Since the maximum delay of the basic pulse CP2 is the time corresponding to a pixel of the image, the basic pulse CP2 may be delayed to be equal to the next basic pulse CP3 as shown in (c) and (d) of FIG. 5. If the basic pulse CP2 is delayed an additional time z, as shown in (e), due to a variation of a delay circuit, the next combination of the delay circuits is selected by the next image data arriving with the next basic pulse CP1. This expands the additional portion z of the previous output pulse to the width corresponding to the next data as shown in (f). Such a case becomes serious when a brush-like pulse is generated by the latch basic pulse CP1 and the longest delay-time delay circuit is selected (or the total delay time of the combination is very large).

In this embodiment where four circuits and four basic pulses are used, on the other hand, the delay of the basic pulse CP2 is assuredly finished when the next latch pulse arrives, and no such problem occurs. If, however, the delay time of the delay buffers of the delay circuits are strictly controlled (i.e., if no variation is expectable), four circuits are not necessary but one or two circuits can be used.

In the embodiment described above, the reference pulse CP2— for determining the delay can be replaced by the basic pulse CP2 itself.

What is claimed is:

1. A laser beam controller for controlling laser beam radiation duration according to image data in a laser optical system where a latent image is formed on a photoreceptor surface by scanning the laser beam, comprising:

a basic pulse signal generating circuit for generating a periodically occurring basic pulse signal;

a delay circuit for delaying said basic pulse signal by a delay time, wherein the delay circuit includes n delay means with different delay times, wherein the delay times of said n delay means are set with the weights of $2^n$, wherein n is 0, 1, 2, . . . , n;

a delay control circuit for controlling the delay time of said basic pulse signal in said delay circuit according to image data, wherein the delay control circuit includes selecting means for selecting a delay means from among said delay means of said delay circuit;

a pulse generating circuit for generating an output pulse having a width corresponding to the delay time of said basic pulse signal; and means for generating a laser beam in said optical system for a duration corresponding to the width of the output pulse by said pulse generating circuit.

2. A laser beam controller according to claim 1, wherein said basic pulse signal generating circuit generates N basic pulse signals with different phases.

3. A laser beam controller according to claim 1, wherein said delay circuit comprises n delay means whose delay times are set with the weight of $2^n$ ($n=0, 1, 2, \ldots, n$) and said delay time control means controls the delay time of a basic pulse signal by individually controlling the actuation of said n delay means with each bit of image data.

4. A laser beam controller according to claim 1, further comprising pulse generation suppressing means for forcefully preventing an output pulse from being generated by said pulse generation circuit when no image data exists.

5. A laser beam controller according to claim 1, further comprising means for limiting operation of said pulse generating circuit so that, when image data corresponding to a value larger than a predetermined maximum value is entered, a result is obtained which is the same as a result obtained when image data of said predetermined maximum value is entered.

6. A laser beam controller according to claim 5, wherein the image data of said predetermined maximum value correspond to image data which delay the basic pulse so that the pulse generating circuit can generate an output pulse of a width equal to the width of one pixel of the image.

7. A laser beam controller for controlling laser beam radiation duration according to image data in a laser optical system where a latent image is formed on a photoreceptor surface by scanning the laser beam, comprising:

a basic pulse signal generating circuit for generating a periodically occurring basic pulse signal;

a delay circuit for delaying said basic pulse signal by a delay time;

a delay control circuit for controlling the delay time of said basic pulse signal in said delay circuit according to image data;

a pulse generating circuit including plural pulse generating means for generating an output pulse having a width corresponding to the delay time of said basic pulse signal; and means for generating a laser beam in said optical system for a duration corresponding to the width of the output pulse by said pulse generating circuit.

8. A laser beam controller according to claim 7, wherein the generation timings of the pulses generated by said plural pulse generating means correspond to points within the width of a pixel of an image.

9. A laser beam controller according to claim 7, wherein said pulse generating circuit has four pulse generating means.

10. A laser beam controller for controlling laser beam radiation duration according to image data in a laser optical system where a latent image is formed on a photoreceptor surface by scanning the laser beam, comprising:

a basic pulse signal generating circuit for generating N periodically occurring basic pulse signals with different phases, wherein the pulses of said N basic pulse signals are sequentially generated so that when one pulse of a basic pulse signal falls down, one pulse of another basic pulse signal rises up;

a delay circuit for delaying said basic pulse signal by a delay time;

a delay control circuit for controlling the delay time of said basic pulse signal in said delay circuit according to image data;

a pulse generating circuit for generating an output pulse having a width corresponding to the delay time of said basic pulse signal; and means for generating a laser beam in said optical system for a duration corresponding to the width of the output pulse by said pulse generating circuit.

* * * * *